United States Patent
Krishnamoorthy et al.

(10) Patent No.: US 7,923,845 B2
(45) Date of Patent: Apr. 12, 2011

(54) ALIGNMENT FEATURES FOR PROXIMITY COMMUNICATION

(75) Inventors: Ashok V. Krishnamoorthy, San Diego, CA (US); John E. Cunningham, San Diego, CA (US); James G. Mitchell, Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 40 days.

(21) Appl. No.: 11/864,347

(22) Filed: Sep. 28, 2007

(65) Prior Publication Data

US 2009/0085233 A1    Apr. 2, 2009

(51) Int. Cl.
*H01L 23/48* (2006.01)
*H01L 23/52* (2006.01)
*H01L 29/40* (2006.01)

(52) U.S. Cl. ........ 257/777; 257/686; 257/723; 257/731; 257/E23.023

(58) Field of Classification Search .................. 257/778, 257/737, 738, 782, 786, 685, 686, 777, 723, 257/730, 731, 733, E23.015, E23.02, E23.023; 438/107–110, 613
See application file for complete search history.

(56) References Cited

U.S. PATENT DOCUMENTS

| | | | |
|---|---|---|---|
| 6,495,396 B1 | 12/2002 | Drost | |
| 7,018,867 B2 * | 3/2006 | Gracias | 438/110 |
| 7,309,924 B2 * | 12/2007 | Song et al. | 257/778 |
| 2004/0157360 A1 | 8/2004 | Gracias | |
| 2006/0022336 A1 | 2/2006 | Franzon | |
| 2007/0075442 A1 | 4/2007 | Krishnamoorthy | |

FOREIGN PATENT DOCUMENTS

EP    1650801 A2    4/2006

* cited by examiner

*Primary Examiner* — A. Sefer
*Assistant Examiner* — Dilinh P Nguyen
(74) *Attorney, Agent, or Firm* — Park, Vaughan Fleming & Dowler, LLP

(57) ABSTRACT

Embodiments of a semiconductor die that includes proximity connectors proximate to a first surface of the semiconductor die are described. This semiconductor die is configured to communicate signals with another semiconductor die via proximity communication through one or more of the proximity connectors. Moreover, the semiconductor die includes a positive feature coupled to a second surface of the semiconductor die that facilitates mechanical alignment of the semiconductor die with the other semiconductor die. Note that a first region around the positive feature defines a first plane, and the positive feature protrudes above the first plane.

19 Claims, 12 Drawing Sheets

~ 1000

```
┌─────────────────────────────────────────────────────────────┐
│ POSITIONING A FIRST SEMICONDUCTOR DIE RELATIVE TO A SECOND  │
│ SEMICONDUCTOR DIE WHERE THE FIRST SEMICONDUCTOR DIE AND THE │
│ SECOND SEMICONDUCTOR DIE ARE CONFIGURED TO COMMUNICATE SIGNALS │
│ VIA PROXIMITY COMMUNICATION THROUGH A FIRST SET OF PROXIMITY │
│ CONNECTORS PROXIMATE TO A FIRST SURFACE OF THE FIRST        │
│ SEMICONDUCTOR DIE AND A SECOND SET OF PROXIMITY CONNECTORS  │
│ PROXIMATE TO A SECOND SURFACE OF THE SECOND SEMICONDUCTOR DIE │
│                            1010                              │
└─────────────────────────────────────────────────────────────┘
                              │
                              ▼
┌─────────────────────────────────────────────────────────────┐
│ COUPLING A POSITIVE FEATURE, WHICH IS COUPLED TO A THIRD SURFACE OF │
│ THE FIRST SEMICONDUCTOR DIE, TO A NEGATIVE FEATURE, WHICH IS │
│ COUPLED TO A FOURTH SURFACE OF THE SECOND SEMICONDUCTOR DIE, │
│ WHERE THE COUPLING FACILITATES ALIGNMENT OF THE FIRST SET OF │
│ PROXIMITY CONNECTORS AND THE SECOND SET OF PROXIMITY CONNECTORS, │
│ WHERE A FIRST REGION AROUND THE POSITIVE FEATURE DEFINES A FIRST │
│ PLANE AND A SECOND REGION AROUND THE NEGATIVE FEATURE DEFINES A │
│ SECOND PLANE, AND WHERE THE POSITIVE FEATURE PROTRUDES ABOVE THE │
│ FIRST PLANE AND THE NEGATIVE FEATURE IS RECESSED BELOW THE SECOND │
│                           PLANE                              │
│                            1012                              │
└─────────────────────────────────────────────────────────────┘
```

FIG. 10

ALIGNMENT FEATURES FOR PROXIMITY COMMUNICATION

GOVERNMENT LICENSE RIGHTS

This invention was made with United States Government support under Contract No. NBCH3039002 awarded by the Defense Advanced Research Projects Administration. The United States Government has certain rights in the invention.

CROSS REFERENCE TO RELATED APPLICATIONS

This application is related to pending U.S. patent application Ser. No. 11/243,300, filed on Oct. 3, 2005, the contents of which are herein incorporated by reference.

BACKGROUND

1. Field of the Invention

The present invention relates to techniques for aligning semiconductor dies. More specifically, the present invention relates to a method and an apparatus that facilitate proximity communication by aligning proximity connectors on adjacent semiconductor dies.

2. Related Art

Advances in semiconductor technology presently make it possible to integrate large-scale systems, which can include tens of millions of transistors, into a single semiconductor die or chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem has created a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, the first chip can directly transmit signals to the second chip without having to route the signals through intervening signal lines within a printed circuit board.

Capacitive coupling requires precise alignment between the transmitter pads and the receiver pads (both of which are more generally referred to as proximity connectors), both in a plane defined by the pads and in a direction perpendicular to the plane. Misalignment between the transmitter pads and the receiver pads may cause each receiving pad to span two transmitting pads, thereby destroying a received signal. In theory, for communication to be possible chips must be aligned so that misalignment is less than half of a pitch between the pads. In practice, the alignment requirements may be more stringent. In addition, reducing misalignment can improve communication performance between the chips and reduce power consumption.

Unfortunately, it can be very challenging to align chips properly. Existing approaches include mechanical mounting structures that facilitate self-alignment and/or self-adjustment of pad positions. FIG. 1 illustrates one such approach in which negative features, such as etch pits 112, and micro-spheres 114 are used to align semiconductor dies 110 (and thus proximity connectors) in a multi-chip module (MCM). These etch-pits can be defined photolithographically using a subtractive process (i.e., a photolithographic process that removes material) before, during, or after circuit fabrication on the semiconductor dies 110. This enables the etch pits 112 to be accurately placed on the semiconductor dies 110 in relationship to circuits and the proximity connectors. Therefore, the photolithographic alignment between the etch pits 112 and circuits establishes precise alignment between circuits on the top and bottom semiconductor dies 110.

Note that the alignment in the X, Y, and Z directions, as well as the angular alignment between semiconductor dies 110, depends only on the relative sizes of the etch-pits 112 and the micro-spheres 114, and on the orientation and placement of the etch pits 112 on the semiconductor dies 110. In particular, the lateral alignment between circuits on the semiconductor dies 110 is achieved in a 'snap-fit' manner, provided the micro-spheres 114 are appropriately sized to fit into the etched pits 112. Clearly, micro-spheres 114 that are too large do not fit into the etch pits 112, and micro-spheres 114 that are too small do not properly align the top and bottom semiconductor dies 110. However, if the micro-spheres 114 sit in the groove of the etch pits 112 correctly (for example, their equators lie exactly at or higher than the surface of the semiconductor die 110-1 and exactly at or lower than the surface of semiconductor die 110-2) then circuits on the top and bottom semiconductor dies 110 are precisely aligned. Similarly, alignment in the Z direction is a function of the photolithographic feature size of the etch pits 112, the etch depth of the etch pits 112, and the diameter of the micro-spheres 114.

While this approach is useful and applicable to packaging and assembly of MCMs that include two or more semiconductor dies 110, it suffers from the limitation that the placement of micro-spheres 114 into the etch-pits 112 is not a parallel, wafer-scale process that can be readily performed at a foundry. Instead, the micro-spheres 114 are often placed into individual semiconductor dies 110 after fabrication. Consequently, this approach may add complexity and cost to the assembly process of MCMs.

Hence, what is needed is a method and an apparatus that facilitates aligning proximity connectors without the problems listed above.

SUMMARY

One embodiment of the present invention provides a semiconductor die that includes proximity connectors proximate to a first surface of the semiconductor die. This semiconductor die is configured to communicate signals with another semiconductor die via proximity communication through one or more of the proximity connectors. Moreover, the semiconductor die includes a positive feature coupled to a second surface of the semiconductor die that facilitates mechanical alignment of the semiconductor die with the other semiconductor die. Note that a first region around the positive feature defines a first plane, and the positive feature protrudes above the first plane.

In some embodiments, the positive feature is fabricated using an additive semiconductor manufacturing process in which material is added to the second surface. However, in some embodiments the positive feature is fabricated using a subtractive semiconductor manufacturing process in which material is subtracted from the second surface.

In some embodiments, a shape of the positive feature is determined using a lithographic process.

In some embodiments, the semiconductor die further includes a negative feature coupled to a third surface of the semiconductor die. Note that a second region around the negative feature defines a second plane, and the negative feature is recessed below the second plane.

In some embodiments, the negative feature includes a trench. This trench may include a material to facilitate relief of mechanical stress when the semiconductor die is coupled to the other semiconductor die.

In some embodiments, the negative feature includes a depression. For example, at least a portion of the depression may have a pyramidal shape. Furthermore, in some embodiments the negative feature includes a slot.

In some embodiments, the positive feature facilitates coupling power to circuits on the semiconductor die. Moreover, in some embodiments the positive feature facilitates coupling electrical signals or optical signals to the semiconductor die.

In some embodiments, the positive feature includes a key structure that specifies an orientation of the semiconductor die with respect to the other semiconductor die. Furthermore, in some embodiments the key structure determines the other semiconductor die which the semiconductor die is configured to couple to.

In some embodiments, the positive feature includes a ridge. This ridge may include a material to facilitate relief of mechanical stress when the semiconductor die is coupled to the other semiconductor die.

In some embodiments, the positive feature includes a protrusion. For example, at least a portion of the protrusion may have: a pyramidal shape, a top-hat shape, or a hemispherical shape.

Another embodiment of the present invention provides a computer system that includes a first semiconductor die and a second semiconductor die. These semiconductor dies are configured to communicate signals using sets of proximity connectors that are aligned by coupling a positive feature on the first semiconductor die with a negative feature on the second semiconductor die.

Another embodiment of the present invention provides a method for reducing misalignment between two semiconductor dies. During this method, the first semiconductor die is positioned relative to the second semiconductor die. Note that the first semiconductor die and the second semiconductor die are configured to communicate signals via proximity communication through sets of proximity connectors. Then, a positive feature, which is coupled to a first surface of the first semiconductor die, is coupled to a negative feature, which is coupled to a second surface of the second semiconductor die. Note that this coupling facilitates alignment of the sets of proximity connectors.

BRIEF DESCRIPTION OF THE FIGURES

FIG. 10 is a flow chart illustrating a process for reducing misalignment between two semiconductor dies in accordance with an embodiment of the present invention.

Note that like reference numerals refer to corresponding parts throughout the drawings.

DETAILED DESCRIPTION

Figure 1:
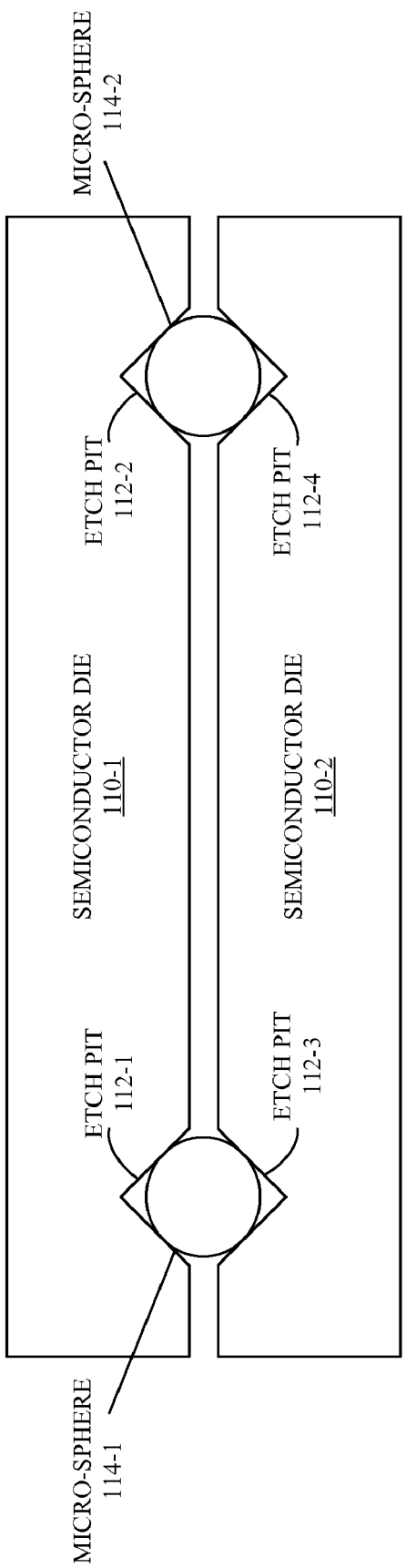
FIG. 1 is a block diagram illustrating an existing multi-chip module (MCM).

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a method, a semiconductor die, an MCM, and systems that include the MCM are described. Note that the MCM, which is sometimes referred to as a macro-chip, includes an array of chip modules (CMs) or single-chip modules (SCMs), and a given SCM includes at least one semiconductor die. Furthermore, the semiconductor die communicates with other semiconductor dies, SCMs, and/or devices in the MCM using proximity communication of electrical (capacitively coupled) signals and/or proximity communication of optical signals (which are, respectively, sometimes referred to as electrical proximity communication and optical proximity communication). This proximity communication occurs via proximity pads or connectors that are located on or are proximate to a surface of the semiconductor die.

Alignment of proximity connectors on neighboring or adjacent semiconductor dies or components is facilitated by features on one or more surface of the semiconductor dies. In particular, a given semiconductor die may include positive features (which protrude or extend above a surrounding region) that are photolithographically defined using an additive (i.e., a material-deposition) and/or a subtractive (i.e., a material-removal) processes. These positive features may include: hemispheres, bumps or top-hat shapes, ridges, pyramids, and/or truncated pyramids. In some embodiments, positive features on a first semiconductor die mate with or couple to negative features (which is positioned below or recessed relative to a surrounding region) on a second semiconductor die. Furthermore, in some embodiments positive and/or negative features (such as an etch pit or slot) are used in combination with micro-spheres or balls. For example, the micro-spheres may be used to couple power or optical signals to the semiconductor die, as well as providing the necessary alignment between the semiconductor dies. Note that this approach to aligning proximity connectors can be implemented in a wafer-scale process, thereby facilitating simpler and lower cost assembly of MCMs.

Embodiments of the semiconductor die may be used in a variety of applications, including: telephony, storage area networks, data centers, networks (such as local area networks), and/or computer systems (such as multi-processor computer systems). For example, the semiconductor die may be included in a switch in a backplane that is coupled to multiple processor blades, or in a switch that is coupled to different types of components (such as processors, memory, I/O devices, and/or peripheral devices).

Figure 2:
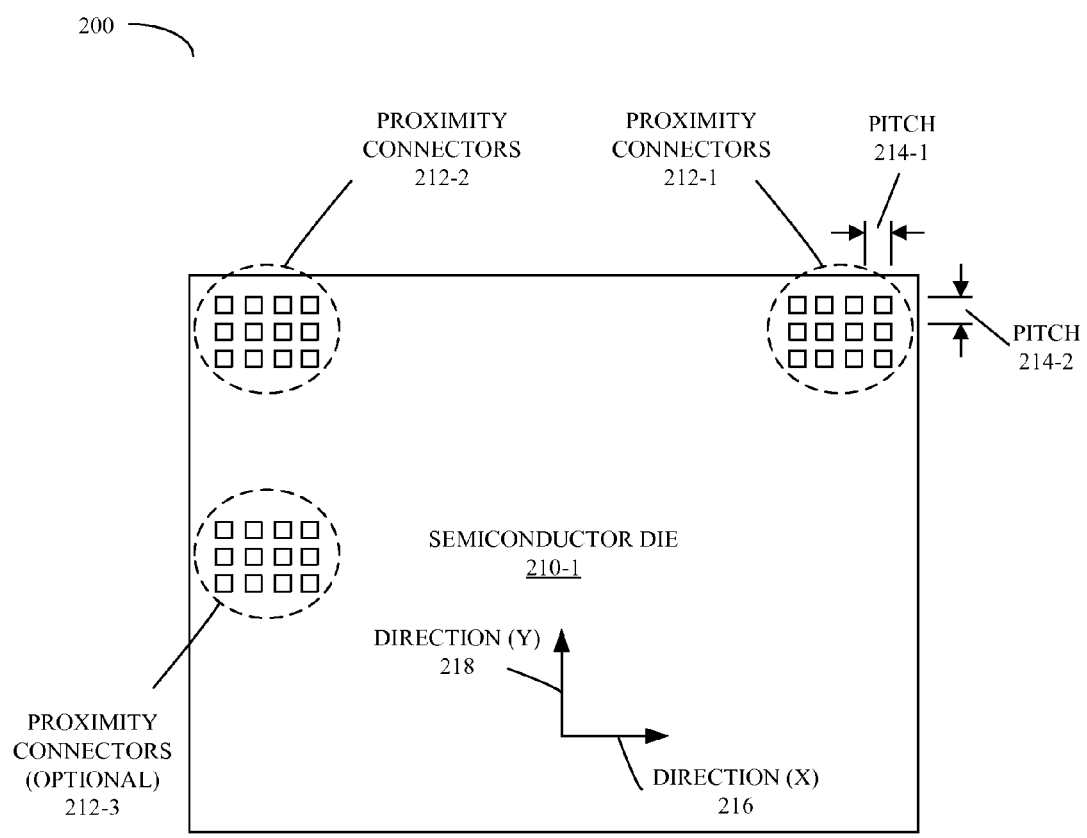
FIG. 2 is a block diagram illustrating a device that includes proximity connectors in accordance with an embodiment of the present invention.

We now describe embodiments of a semiconductor die and an MCM. FIG. 2 presents a block diagram illustrating an embodiment of a device 200 that includes proximity connectors 212 (which may be capacitive, optical, inductive, and/or conductive-based connectors). Device 200 may include at least one semiconductor die 210, where semiconductor die 210 may include integrated circuit electronics corresponding to layers deposited on a semiconductor substrate. Note that semiconductor die 210 may be packaged in an SCM and/or an MCM, where the MCM may include two or more SCMs. When packaged, for example in the SCM or the MCM, semiconductor die 210 is sometimes referred to as a "chip."

In one embodiment, the proximity connectors 212 may be located on or proximate to at least one surface of the semiconductor die 210, the SCM and/or the MCM. In other embodiments, the semiconductor die 210, the SCM and/or the MCM may be coupled to the proximity connectors 212. In an exemplary embodiment, the proximity connectors 212 are substantially located at or near one or more corners (proximity connectors 212-1 and 212-2) and/or edges (proximity connectors 212-3) of the semiconductor die 210. In other embodiments, proximity connectors 212 may be situated at one or more arbitrary locations on, or proximate to, the surface of the semiconductor die 210.

As illustrated for the proximity connectors 212-1, there is a first pitch 214-1 between adjacent connectors or pads in a first direction (X) 216 of the surface and a second pitch 214-2 between adjacent connectors or pads in a second direction (Y) 218 of the surface. In some embodiments, the first pitch 214-1 and the second pitch 214-2 are approximately equal.

Figure 3:
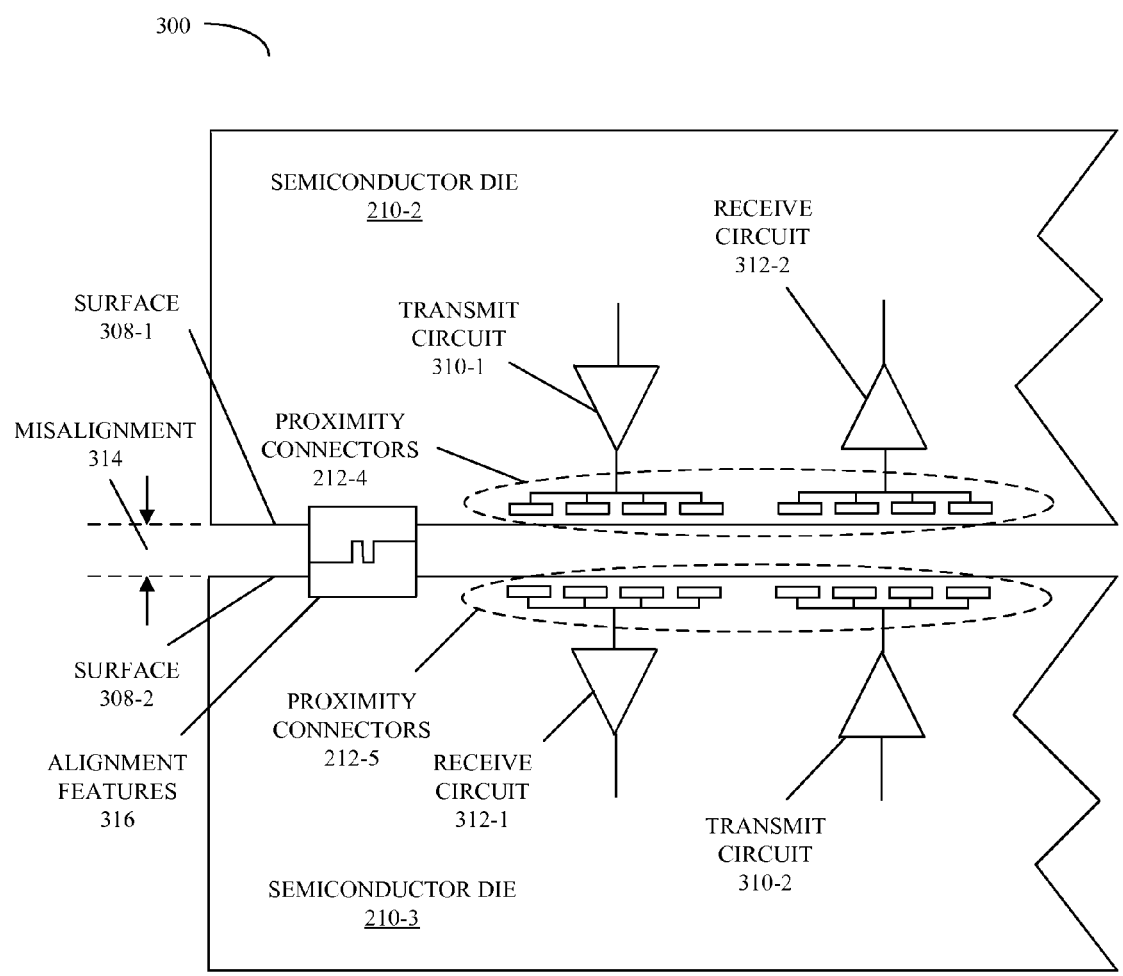
FIG. 3 is a block diagram illustrating an MCM that includes semiconductor dies that communicate using proximity communication in accordance with an embodiment of the present invention.

FIG. 3 presents a block diagram illustrating an embodiment of an MCM 300 that includes semiconductor dies 210 that communicate using capacitively coupled proximity communication (which is used as an illustration). Semiconductor dies 210 may include proximity connectors or pads 212 that are located on or proximate to at least surfaces 308 of the semiconductor dies 210. For example, the proximity connectors 212 may be situated beneath protective layers such that they are located below the surfaces 308. Moreover, subsets of the proximity connectors 212 may be coupled to transmit circuits 310 (such as transmit drivers) and receive circuits 312 (such as receivers). One of the transmit circuits 310, at least a subset of the proximity connectors 212 on the adjacent semiconductor dies 210, and one of the receive circuits 312 may constitute a communication channel. For example, the communication channel may include transmit circuit 310-1, some of the proximity connectors 212, and receive circuit 312-1. Note that transmit circuits 310 and receive circuits 312 may utilize voltage-mode signaling (i.e., voltage-mode drivers and receivers). Furthermore, semiconductor dies 210 may also include wiring and electronics (not shown) to relay the data signals to additional electronics on the semiconductor dies 210, such as logic, memory (for example, a packet buffer memory), I/O ports, demultiplexers, multiplexers, and switching elements.

In order to communicate data signals using proximity communication, transmit and receive proximity connectors 212 on adjacent semiconductor dies 210 may have, at worst, only limited misalignment, i.e., substantially accurate alignment. For densely packed proximity connectors, i.e., proximity connectors 212 having a small spacing or pitch 214 (FIG. 2) between adjacent pads, the alignment between two or more proximity connectors 212 on adjacent semiconductor dies 210 may be within a few microns in the first direction (X) 216 (FIG. 2) and/or a few microns in the second direction (Y) 218 (FIG. 2) in a first plane including at least some of the proximity connectors 212, and/or within a few microns in a third direction (Z) approximately perpendicular to the first plane. Note that MCM 300 illustrates a misalignment 314 in the third direction (Z).

In some embodiments, the proximity connectors 212 may be aligned in six degrees of freedom, including: the first direction (X) 216 (FIG. 2); the second direction (Y) 218 (FIG. 2); the third direction (Z); an angle in the first plane defined by the first direction (X) 216 (FIG. 2) and the second direction (Y) 218 (FIG. 2); an angle in a second plane defined by the first direction (X) 216 (FIG. 2) and the third direction (Z); and an angle in a third plane defined by the second direction (Y) 218 (FIG. 2) and the third direction (Z). Note that X 216, Y 218, and Z are the normal orthogonal axes of 3-space. Also note that if a surface, such as the surface 308-1, of either of the adjacent semiconductor dies 210 is non-planar (for example, due to quadrapole distortion), additional alignment problems may be introduced.

In some embodiments, allowed misalignment in the first direction (X) 216 (FIG. 2), the second direction (Y) 218 (FIG. 2) and/or the third direction (Z) is less than one half of the pitch 214 (FIG. 2) between adjacent pads 212. For example, misalignment in the first direction (X) 216 (FIG. 2) and/or the second direction (Y) 218 (FIG. 2) may be less than 25 µm, and the misalignment 314 in the third direction (Z) may be less than 5 µm. In some embodiments, the misalignment 314 is between 1 and 10 µm.

Solutions, such as self-alignment and/or self-adjustment of relative positions of the proximity connectors 212 on adjacent semiconductor dies 210 and/or in a component (such as a bridge chip) coupling two or more semiconductor dies 210, may reduce and/or eliminate the misalignment 314 in the third direction (Z). For example, structures that have flexibility compliance or are spring like may be used. In other embodiments, a feedback control loop may be used to reduce and/or eliminate the misalignment 314 in the third direction (Z). Moreover, as discussed further below, alignment of the semiconductor dies 210 (and thus, at least some of the proximity connectors 212) may be facilitated by coupling of alignment features 316 on or proximate to the surfaces 308.

Reducing or eliminating the misalignment 314, in turn, may lead to at least partial overlap of one or more proximity connectors 212 on the adjacent semiconductor dies 210 and increase a magnitude of the capacitively coupled data signals. In addition, the solutions may reduce misalignment in the first plane, i.e., the plane including at least some of the proximity connectors 212, when used in conjunction with techniques such as electronic steering (where data signals are routed to given proximity connectors 212 based on the alignment in the first plane). Consequently, these solutions may facilitate proximity communication between the semiconductor dies 210, SCMs and/or MCMs. The solutions may also reduce and/or eliminate a need for narrow tolerances, precise manufacturing, and/or precise assembly of the semiconductor dies 210, the SCM and/or the MCM.

In the embodiments described above and below, the proximity connectors 212 on the adjacent semiconductor dies 210 utilize capacitive coupling for inter-chip communication. In other embodiments, different connectors may be overlapped on adjacent semiconductor dies 210. For example, one embodiment of the present invention uses optical proximity connectors, in which data signals are communicated optically between terminals on adjacent semiconductor dies 210. Other embodiments use magnetic proximity connectors, in which data signals are communicated magnetically between terminals on closely adjacent semiconductor dies 210, or conductive connectors (such as an array of solder balls).

In some embodiments, semiconductor dies 210 are included in an array of semiconductor dies in an MCM. For example, as illustrated in FIG. 3, semiconductor dies 210 in such an array may be positioned face-to-face, such that proximity connectors 212 on the corners (and more generally on side edges) of the semiconductor dies 210 overlap and couple signals between adjacent semiconductor dies using, for example, capacitively coupled proximity communication. In another embodiment, the semiconductor dies 210 are face up (or face down) and signals between adjacent semiconductor dies are capacitively coupled via a face-down (or face-up) bridge component.

While the device 200 (FIG. 2) and the MCM 300 are illustrated as having a number of components in a given configuration, in other embodiments the device 200 (FIG. 2) and/or the MCM 300 may include fewer components or additional components, two or more components may be combined into a single component, and/or a position of one or more components may be changed. Furthermore, functions of the MCM 300 may be implemented in hardware and/or in software.

We now described embodiments of alignment features, such as alignment features 316. In general, a wide variety of features, including positive features and negative features, may be used. These features may be fabricated on a wide variety of materials, including a semiconductor, a metal, a glass, sapphire, and/or silicon dioxide. In the discussion that follows silicon is used as an illustrative example. Furthermore, the features may be fabricated using additive and/or subtractive processes, including sputtering, isotropic etching, and/or anisotropic etching. In some embodiments, features are defined using photolithographic and/or direct-write techniques.

FIGS. 4A-4D provide embodiments 400, 430, 450, and 470 that illustrate positive features fabricated on semiconductor dies 410, including: hemispheres 412, ridges, top-hat shapes or bumps 440, pyramids 460, and/or truncated pyramids 480. These features may mate with or couple to corresponding negative features facilitating 'snap-fit' assembly, thereby providing and maintaining precise alignment. Note that these negative features may include: slots, trenches, etch pits, pyramids, and/or truncated pyramids.

Integrated hemispheres 412 provide a direct approach for achieving wafer-scale assembly of an MCM by supplementing or replacing the use of micro-spheres or balls (as illustrated in FIG. 1). These hemispheres may be defined on semiconductor die 410-1 using standard photoresist. Then, the photoresist may be annealed to reflow the material and to allow surface tension to draw the photoresist into hemispherical shapes. Next, the formed half lenses may be hard-baked into the solid-glass hemispheres 412, which are ready to be mated with etch pits (and more generally, negative features) on the opposing chip or semiconductor die in an MCM. Alternatively, metal bumps (such as bumps 440 in FIG. 4B) may be lithographically patterned. These bumps may be reflowed and allowed to cool. During the cooling operation, surface tension may lead to the formation of hemispherical-shaped metal bumps.

Figure 4A:
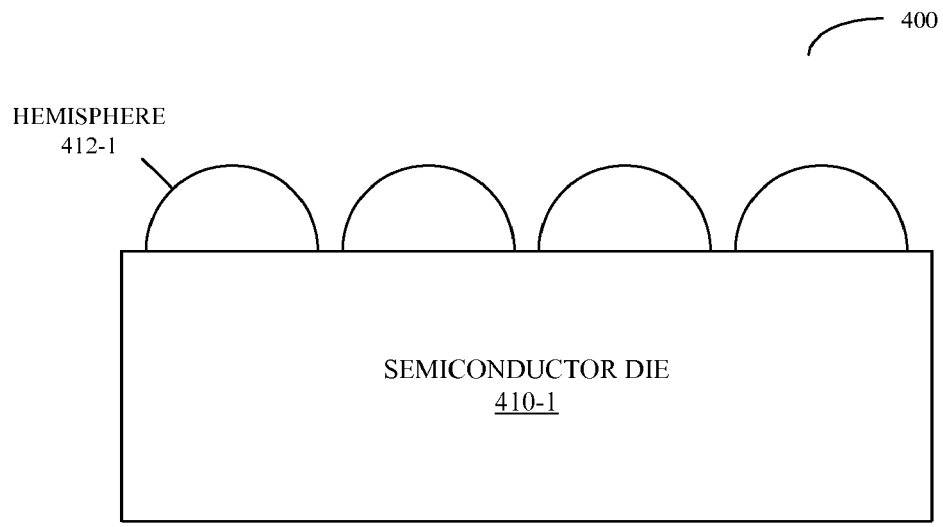
FIG. 4A is a block diagram illustrating a semiconductor die in accordance with an embodiment of the present invention.
Figure 4B:
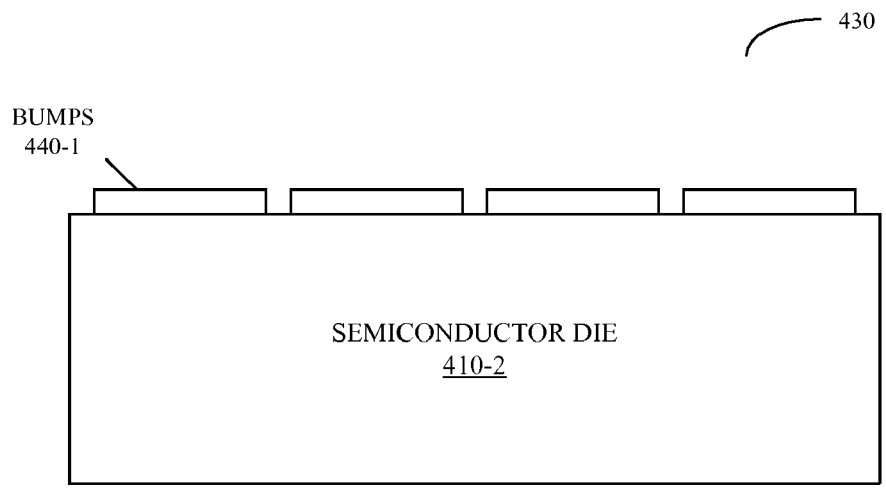
FIG. 4B is a block diagram illustrating a semiconductor die in accordance with an embodiment of the present invention.
Figure 4C:
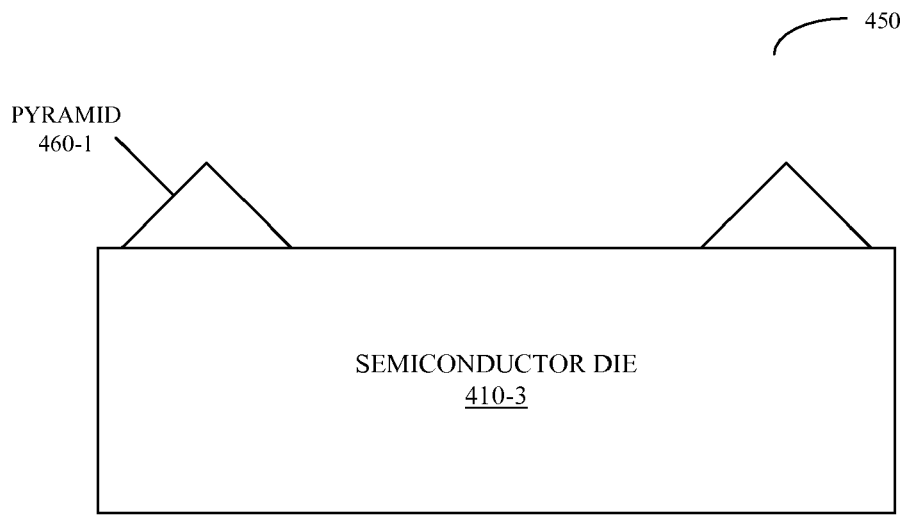
FIG. 4C is a block diagram illustrating a semiconductor die in accordance with an embodiment of the present invention.
Figure 4D:
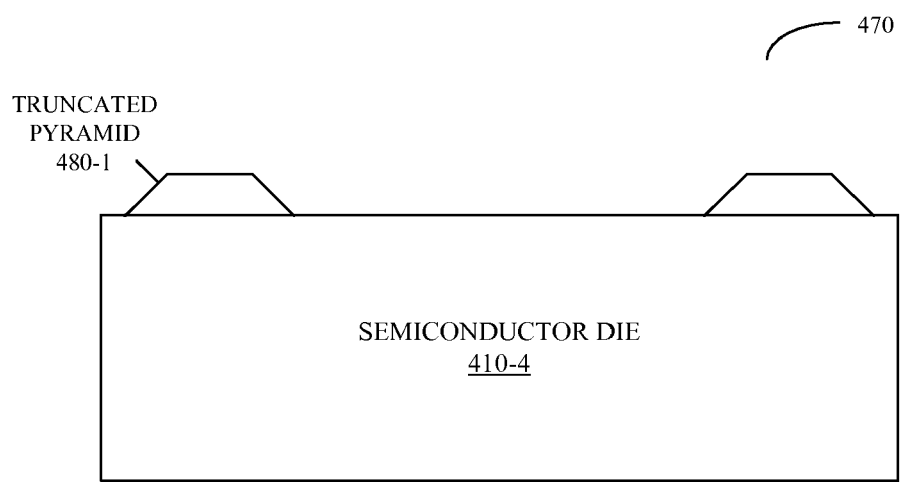
FIG. 4D is a block diagram illustrating a semiconductor die in accordance with an embodiment of the present invention.

As noted previously, positive features may also be fabricated using a subtractive process, for example, by selective etching into a silicon substrate. Thus, instead of defining a mask opening into which an etch pit is formed a mask area may protect a portion of the substrate from etching. In this case, the region surrounding the mask area is etched. Note that the etching may be self-limiting or self-terminating, such as anisotropic lithography along the <111> crystallographic direction to produce pyramids 460 (FIG. 4C). However, in some embodiments etch stops are defined, for example, using CMOS technology.

In some embodiments an isotropic etch may be used to produce a mesa or bump 440 (FIG. 4B) or to produce truncated pyramids 480 (in which the sides are along the <111> crystallographic direction and top is, for example, along the <100> crystallographic direction). Alternatively, truncated pyramids 480 may be fabricated by stopping an anisotropic etch prior to completion (such as when a desired etch depth is reached).

While embodiments 400 (FIG. 4A), 430 (FIG. 4B), 450 (FIG. 4C), and 470 (and the embodiments described below) are illustrated as having a limited number of positive features having a given configuration, other embodiments may include fewer components or additional components, two or more components may be combined into a single component, and/or a position of one or more components may be changed. For example, the positive features may be fabricated in one or more directions. Thus, in some embodiments positive features such as hemispheres 412 (FIG. 4A) have a hexagonal-closed-packed configuration. Furthermore, a wide variety of materials may be used for the positive and/or negative features. And in some embodiments, a given semiconductor die includes both positive and negative features, thereby breaking the symmetry and ensuring that chips can only be assembled in one physical arrangement or orientation (note that another approach, described below with reference to FIG. 7, uses a key-shaped feature).

Figure 5A:
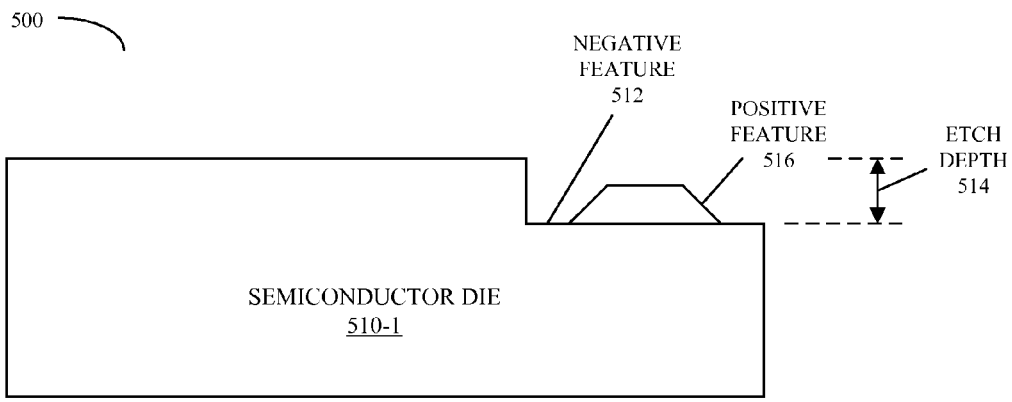
FIG. 5A is a block diagram illustrating a semiconductor die in accordance with an embodiment of the present invention.
Figure 5B:
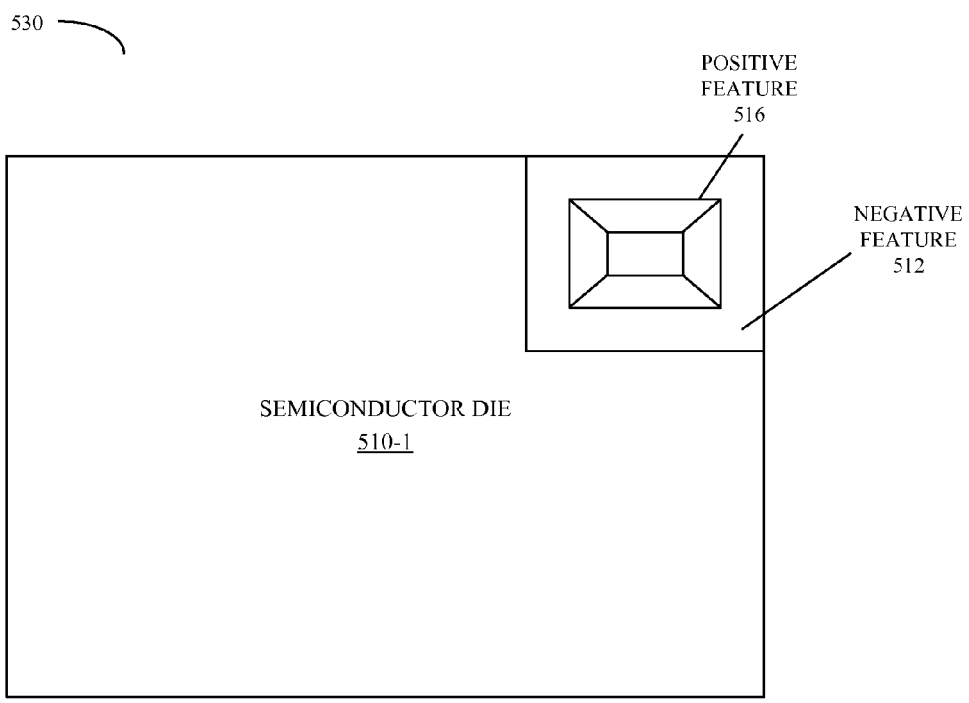
FIG. 5B is a block diagram illustrating a semiconductor die in accordance with an embodiment of the present invention.

FIGS. 5A and 5B provide block diagrams that illustrate a side-view 500 and a top-view 530 of an embodiment of a semiconductor die 510. This embodiment illustrates the combination of positive and negative features. In particular, negative feature 512 (defined by an etch depth 514) may be combined with positive feature 516. This configuration may be fabricated by etching negative feature 512 and then depositing positive feature 516. Alternatively, by depositing photoresist in the central area of positive feature 516 both features may be defined concurrently during an etch operation. Note that in this case the height of positive feature 516 may extend to the surface of semiconductor die 510, i.e., the height of positive feature 516 would equal the etch depth 514. This co-planar arrangement can promote alignment of semiconductor dies in an MCM, for example, by reducing misalignment 314 (FIG. 3). Alternatively, an additional etch operation may be used to recess the top of the positive feature 516 relative to the surface of semiconductor die 510.

Figure 6A:
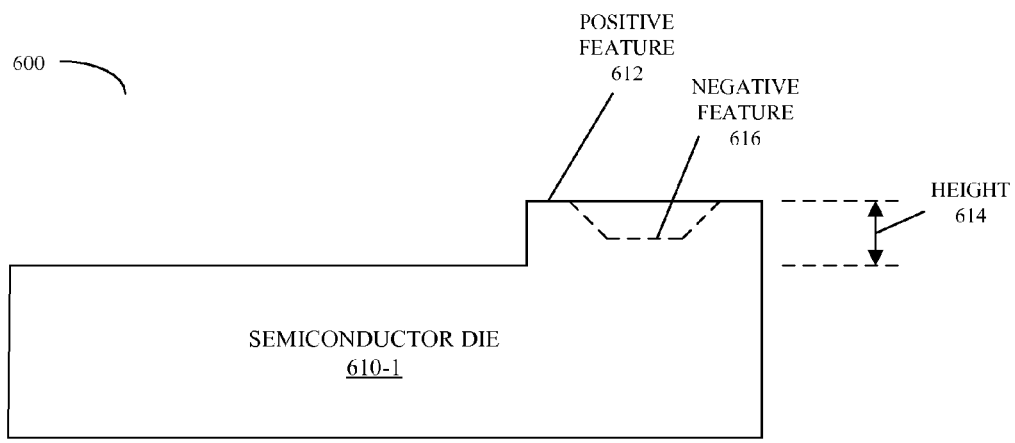
FIG. 6A is a block diagram illustrating a semiconductor die in accordance with an embodiment of the present invention.
Figure 6B:
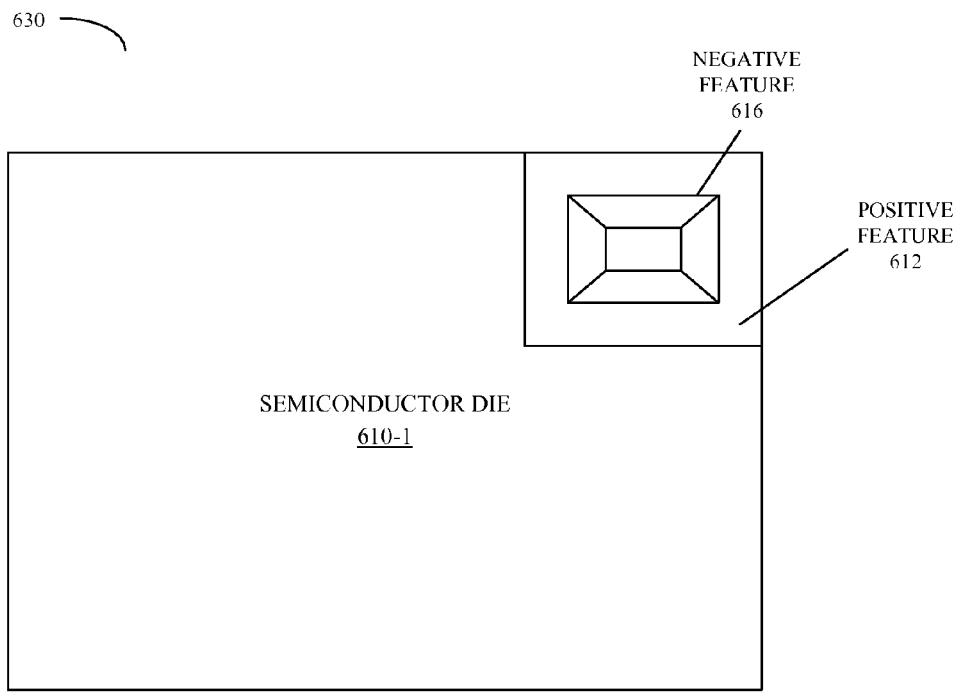
FIG. 6B is a block diagram illustrating a semiconductor die in accordance with an embodiment of the present invention.

FIGS. 6A and 6B provide block diagrams illustrating a side-view 600 and a top-view 630 of an embodiment of a semiconductor die 610. This embodiment also illustrates the combination of a positive feature 612 (defined by a height 614 relative to the surface of semiconductor die 610) and a negative feature 616. These features are configured to mate with those illustrated in FIGS. 5A and 5B to facilitate alignment of these semiconductor dies.

Figure 7:
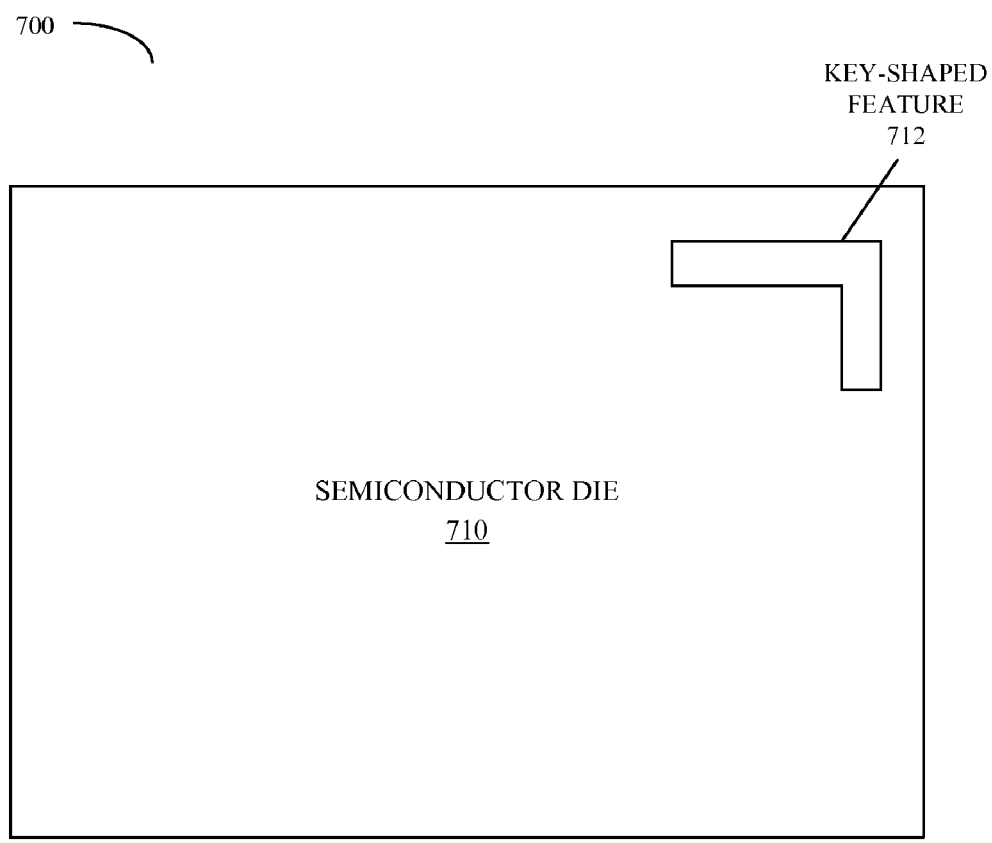
FIG. 7 is a block diagram illustrating a semiconductor die in accordance with an embodiment of the present invention.

In some embodiments, a shape of a positive and/or a negative feature is used to determine an orientation of a semiconductor die or to limit the possible semiconductor dies that a given semiconductor die can mate with in an MCM (thereby facilitating self-assembly of an MCM). This is illustrated in FIG. 7, which provides a block diagram of an embodiment 700 of a semiconductor die 710 that includes a key-shaped feature 712.

Figure 8A:
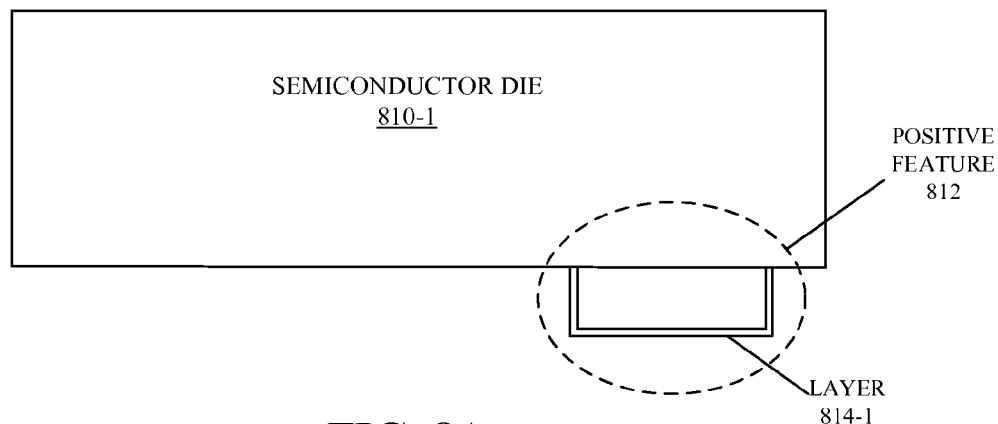
FIG. 8A is a block diagram illustrating a semiconductor die in accordance with an embodiment of the present invention.
Figure 8B:
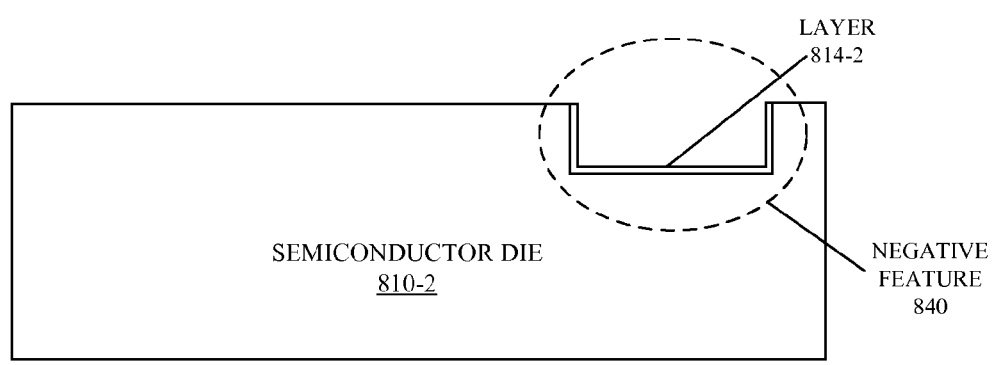
FIG. 8B is a block diagram illustrating a semiconductor die in accordance with an embodiment of the present invention.

In some embodiments, either or both of the mating features on the semiconductor dies include a material, such as a soft metal to provide stress relief (for example, for stress due to relative motion or due to temperature differences) between coupled semiconductor dies. This is shown in FIGS. 8A and 8B, which provide block diagrams of embodiments 800 and 830 of semiconductor dies 810. In particular, positive feature 812 and/or corresponding negative feature 840 may include one or more layers, such as layers 814.

Note that the use of metal layers may also allow micro-spheres in an MCM to couple power to one or more semiconductor dies. In these embodiments, the micro-spheres are made of metal or have a metal (conductive) coating. These micro-spheres may or may not be used to align the semiconductor dies. For example, in some embodiments alignment is facilitated using positive and negative features and micro-spheres are used to couple power or other signals (such as optical signals) to the semiconductor dies. Thus, micro-spheres may include materials such as: sapphire, glass, silicon dioxide, and/or conductive materials (for example, a metal).

Figure 9:
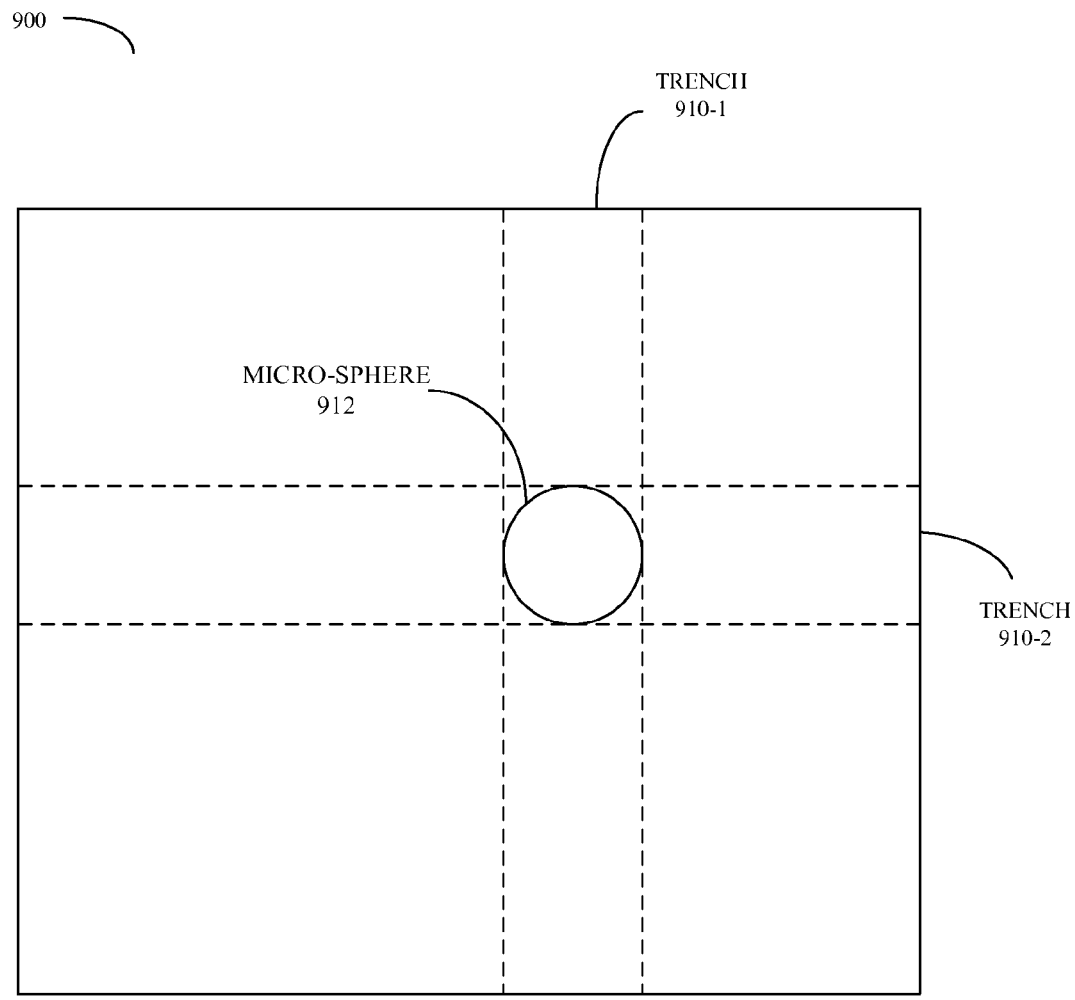
FIG. 9 is a block diagram illustrating an MCM in accordance with an embodiment of the present invention.

However, in some embodiments micro-spheres are used in conjunction with positive and/or negative features to align semiconductor dies. This is illustrated in FIG. 9, which provides a block diagram illustrating a top-view of an embodiment of an MCM 900. This MCM includes semiconductor dies that have orthogonal trenches 910. A micro-sphere 912 maintains boundary conditions and constrains relative motion of the semiconductor dies in the X and/or Y directions. In some embodiments, a soft metal layer, or a solid and/or liquid lubricant is included in one or more of the trenches 910 and/or on the micro-sphere 912. Note that in some embodiments features, such as the trenches 910, may be defined to facilitate alignment but to also allow for motion associated with thermal expansion. For example, one trench may be 1 µm wide and the other may be 1.5 µm wide.

We now describe embodiments of methods for reducing misalignment between two semiconductor dies. FIG. 10 presents a flow chart illustrating an embodiment of a process 1000 for reducing misalignment between two semiconductor dies. During this process, a first semiconductor die is positioned relative to the second semiconductor die (1010). Note that the first semiconductor die and the second semiconductor die are configured to communicate signals via proximity communication through a first set of proximity connectors proximate to a first surface of the first semiconductor die and a second set of proximity connectors proximate to a second surface of the second semiconductor die.

Then, a positive feature, which is coupled to a third surface of the first semiconductor die, is coupled to a negative feature, which is coupled to a fourth surface of the second semiconductor die (1012). Note that this coupling facilitates alignment of the first set of proximity connectors and the second set of proximity connectors. Moreover, a first region around the positive feature defines a first plane and a second region around the negative feature defines a second plane, and the positive feature protrudes above the first plane and the negative feature is recessed below the second plane.

In some embodiments of the process 1000 there may be additional or fewer operations, the order of the operations may be changed, and two or more operations may be combined into a single operation.

Figure 11:
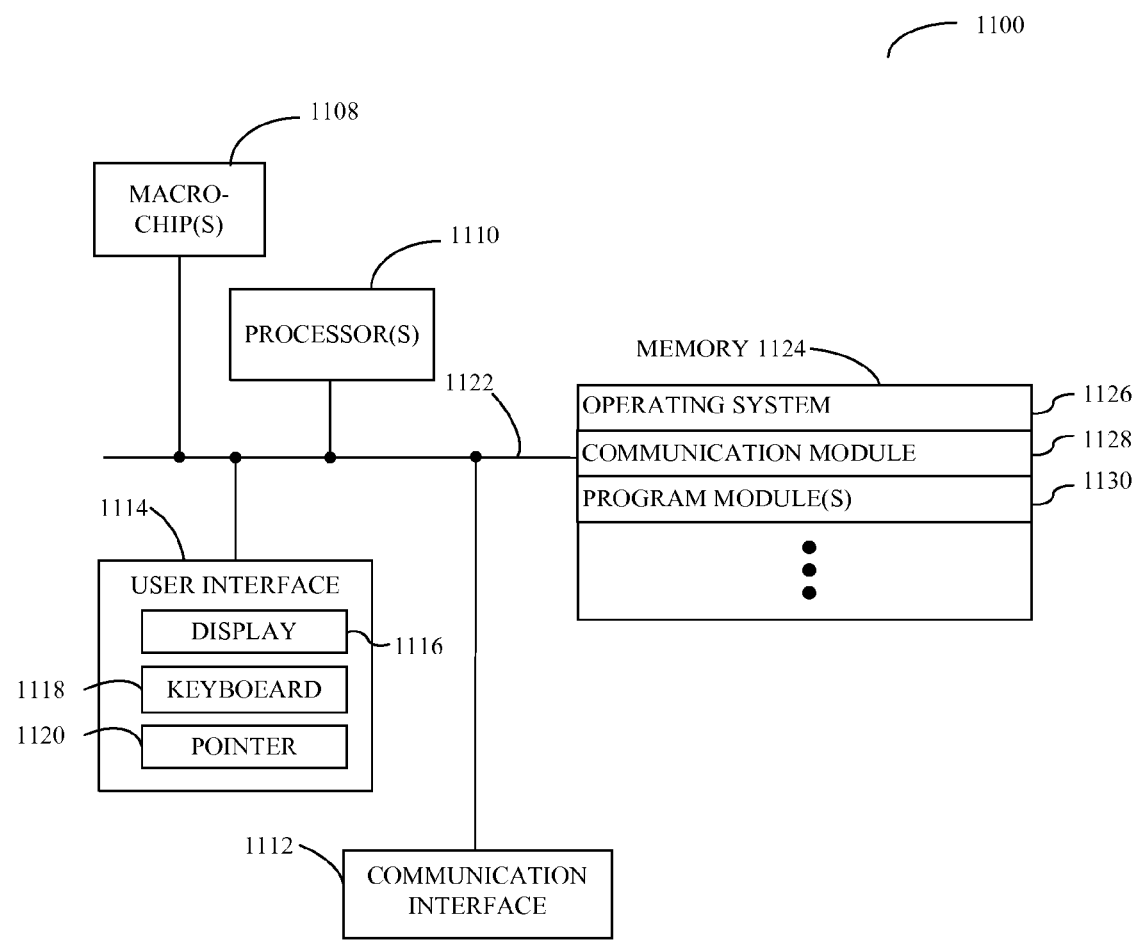
FIG. 11 is a block diagram illustrating a computer system in accordance with an embodiment of the present invention.

Note that the present invention may include systems that contain one or more MCMs, which include components (such as one or more semiconductor dies) that communicate signals using capacitively coupled and/or optically coupled proximity connectors. For example, FIG. 11 presents a block diagram illustrating an embodiment of a computer system 1100, which includes one or more processors 1110, a communication interface 1112, a user interface 1114, and one or more signal lines 1122 coupling these components together. Note that the one or more processing units 1110 may support parallel processing and/or multi-threaded operation, the communication interface 1112 may have a persistent communication connection, and the one or more signal lines 1122 may constitute a communication bus. Moreover, the user interface 1114 may include: a display 1116, a keyboard 1118, and/or a pointer, such as a mouse 1120.

Computer system 1100 may include memory 1124, which may include high speed random access memory and/or non-volatile memory. More specifically, memory 1124 may include: ROM, RAM, EPROM, EEPROM, FLASH, one or more smart cards, one or more magnetic disc storage devices, and/or one or more optical storage devices. Memory 1124 may store an operating system 1126, such as SOLARIS, LINUX, UNIX, OS X, or WINDOWS, that includes procedures (or a set of instructions) for handling various basic system services for performing hardware dependent tasks. Memory 1124 may also store procedures (or a set of instructions) in a communication module 1128. The communication procedures may be used for communicating with one or more computers and/or servers, including computers and/or servers that are remotely located with respect to the computer system 1100.

Memory 1124 may also include the one or more program modules (of sets of instructions) 1130. Instructions in the program modules 1130 in the memory 1124 may be implemented in a high-level procedural language, an object-oriented programming language, and/or in an assembly or machine language. The programming language may be compiled or interpreted, i.e., configurable or configured to be executed by the one or more processing units 1110.

Computer system 1100 may include one or more macro-chips 1108 (such as one or more MCMs) that include semiconductor dies that are aligned using positive and/or negative features as described in the previous embodiments.

Computer system 1100 may include fewer components or additional components, two or more components may be combined into a single component, and/or a position of one or more components may be changed. In some embodiments, the functionality of the computer system 1100 may be implemented more in hardware and less in software, or less in hardware and more in software, as is known in the art.

Although the computer system 1100 is illustrated as having a number of discrete items, FIG. 11 is intended to be a functional description of the various features that may be present in the computer system 1100 rather than as a structural schematic of the embodiments described herein. In practice, and as recognized by those of ordinary skill in the art, the functions of the computer system 1100 may be distributed over a large number of servers or computers, with various groups of the servers or computers performing particular subsets of the functions. In some embodiments, some or all of the functionality of the computer system 1100 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor die, comprising:
proximity connectors proximate to a first surface of the semiconductor die, wherein the semiconductor die is configured to communicate signals with a second semiconductor die via proximity communication through one or more of the proximity connectors; and
a positive feature coupled to a second surface of the semiconductor die which facilitates mechanical alignment of the semiconductor die with the second semiconductor die, wherein a first region around the positive feature defines a first plane, and wherein the positive feature protrudes above the first plane; and
a stress-relief material coupled to the positive feature, wherein the stress relief material is configured to provide mechanical relief from stresses caused by at least one of relative motion or temperature differences when the positive feature has been used to align the first semiconductor die with the second semiconductor die.

2. The semiconductor die of claim 1, wherein the positive feature is fabricated using an additive semiconductor manufacturing process in which material is added to the second surface.

3. The semiconductor die of claim 1, wherein the positive feature is fabricated using a subtractive semiconductor manufacturing process in which material is subtracted from the second surface.

4. The semiconductor die of claim 1, further comprising a negative feature coupled to a third surface of the semiconductor die, wherein a second region around the negative feature defines a second plane, and wherein the negative feature is recessed below the second plane.

5. The semiconductor die of claim 4, wherein the negative feature includes a trench.

6. The semiconductor die of claim 4, wherein the negative feature includes a depression, and wherein at least a portion of the depression has a pyramidal shape.

7. The semiconductor die of claim 4, wherein the negative feature includes a slot.

8. The semiconductor die of claim 1, wherein the positive feature facilitates coupling power to circuits on the semiconductor die.

9. The semiconductor die of claim 1, wherein the positive feature facilitates coupling electrical signals or optical signals to the semiconductor die.

10. The semiconductor die of claim 1, wherein the positive feature includes a key structure, and wherein the second semiconductor die which the semiconductor die is configured to couple to is determined by the key structure.

11. The semiconductor die of claim 1, wherein the positive feature includes a ridge.

12. The semiconductor die of claim 1, wherein the positive feature includes a protrusion, and wherein at least a portion of the protrusion has a pyramidal shape.

13. The semiconductor die of claim 1, wherein the positive feature includes a protrusion, and wherein the protrusion has a top-hat shape.

14. The semiconductor die of claim 1, wherein the positive feature includes a protrusion, and wherein at least a portion of the protrusion has a hemispherical shape.

15. The semiconductor die of claim 1, wherein the positive feature includes a key structure with separate feature aspects in at least two dimensions, and wherein the feature aspects of the key structure are configured so that the first semiconductor die and the second semiconductor die can only be assembled in predetermined physical arrangements.

16. A system, comprising:
a first semiconductor die; and
a second semiconductor die,
wherein the first semiconductor die includes a first set of proximity connectors proximate to a first surface of the first semiconductor die and is configured to communicate signals with the second semiconductor die via proximity communication through the first set of proximity connectors;
wherein the second semiconductor die includes a second set of proximity connectors proximate to a second surface of the second semiconductor die and is configured to communicate signals with the first semiconductor die via proximity communication through the second set of proximity connectors;
wherein the first semiconductor die includes a positive feature coupled to a third surface of the first semiconductor die and the second semiconductor die includes a negative feature coupled to a fourth surface of the second semiconductor die;
wherein a first region around the positive feature defines a first plane and a second region around the negative feature defines a second plane;
wherein the positive feature protrudes above the first plane and the negative feature is recessed below the second plane;
wherein the positive feature couples to the negative feature, thereby facilitating alignment of the first set of proximity connectors and the second set of proximity connectors; and
a stress-relief material coupled between the positive feature and the negative feature, wherein the stress relief material is configured to provide mechanical relief from stresses caused by at least one of relative motion or temperature difference between the first semiconductor die and the second semiconductor die.

17. The system of claim 16, wherein the positive feature includes a key structure and the negative feature includes a corresponding indentation, wherein each of the positive feature and the negative feature include separate feature aspects in at least two dimensions, and wherein the feature aspects are configured so that the first semiconductor die and the second semiconductor die can only be assembled in predetermined physical arrangements.

18. A method for reducing misalignment between two semiconductor dies, comprising:
- positioning a first semiconductor die relative to a second semiconductor die, wherein the first semiconductor die and the second semiconductor die are configured to communicate signals via proximity communication through a first set of proximity connectors proximate to a first surface of the first semiconductor die and a second set of proximity connectors proximate a second surface of the second semiconductor die; and
- coupling a positive feature, which is coupled to a third surface of the first semiconductor die, to a negative feature, which is coupled to a fourth surface of the second semiconductor die, wherein the coupling facilitates alignment of the first set of proximity connectors and the second set of proximity connectors;
- wherein a first region around the positive feature defines a first plane and a second region around the negative feature defines a second plane;
- wherein the positive feature protrudes above the first plane and the negative feature is recessed below the second plane; and
- wherein coupling the positive feature to the negative feature includes coupling a stress-relief material between the positive feature and the negative feature, wherein the stress relief material is configured to provide mechanical relief from stresses caused by at least one of relative motion or temperature difference between the first semiconductor die and the second semiconductor die.

19. The method of claim 18, wherein the positive feature includes a key structure and the negative feature includes a corresponding indentation, wherein each of the positive feature and the negative feature include separate feature aspects in at least two dimensions, and wherein the feature aspects are configured so that the first semiconductor die and the second semiconductor die can only be assembled in predetermined physical arrangements.

* * * * *